United States Patent
Takami et al.

(10) Patent No.: US 6,947,070 B2
(45) Date of Patent: Sep. 20, 2005

(54) VIDEO SCOPE UTILIZED IN ELECTRONIC ENDOSCOPE SYSTEM

(75) Inventors: Satoshi Takami, Saitama (JP); Yukihiro Ishizuka, Tokyo (JP)

(73) Assignee: PENTAX Corporation, Tokyo (JP)

( * ) Notice: Subject to any disclaimer, the term of this patent is extended or adjusted under 35 U.S.C. 154(b) by 610 days.

(21) Appl. No.: 10/150,099

(22) Filed: May 20, 2002

(65) Prior Publication Data

US 2002/0171733 A1 Nov. 21, 2002

(30) Foreign Application Priority Data

May 21, 2001 (JP) .................................. P2001-150335
May 21, 2001 (JP) .................................. P2001-150574

(51) Int. Cl.[7] .................................................. H04N 7/18
(52) U.S. Cl. ................................ 348/76; 348/65; 348/66
(58) Field of Search ................ 348/65–76; 600/100–130

(56) References Cited

U.S. PATENT DOCUMENTS

| | | | | |
|---|---|---|---|---|
| 4,809,680 A | * | 3/1989 | Yabe | 600/130 |
| 4,831,456 A | * | 5/1989 | Takamura | 348/374 |
| 5,365,268 A | * | 11/1994 | Minami | 348/76 |
| 6,417,885 B1 | * | 7/2002 | Suzuki et al. | 348/374 |
| 6,450,947 B1 | * | 9/2002 | Arai | 600/109 |

* cited by examiner

Primary Examiner—Andy Rao
(74) Attorney, Agent, or Firm—Greenblum & Bernstein, P.L.C.

(57) ABSTRACT

A video scope has an image sensor, a circuit board, and a digital signal processor mounted on the circuit board. The digital signal processor reads image signals from the image sensor, and processes the read image signals to thereby produce at least two types of video signal. A wiring-pattern is formed on the circuit board to feed a video signal component, included in one of the two types of video signals, from the digital signal processor. The wiring-pattern is cut off at a suitable location. When the wiring-pattern remains as an unused wiring-pattern on the circuit board, the wiring-pattern is treated such that radiation of noise is prevented from going through the unused wiring-pattern.

15 Claims, 11 Drawing Sheets

VIDEO SCOPE UTILIZED IN ELECTRONIC ENDOSCOPE SYSTEM

BACKGROUND OF THE INVENTION

1. Field of the Invention

The present invention relates to a video scope utilized in an electronic endoscope system, and, in particular, is directed to treatment for unused circuit patterns on an electronic circuit board incorporated in such a video scope.

2. Description of the Related Art

As is well known, an electronic endoscope system includes a video scope or so-called electronic scope, and a video-signal processing unit or so-called processor, to which the video scope is detachably coupled. The video scope has a rigid manipulating-section, and a flexible conduit section extending from the rigid manipulating-section.

The flexible conduit section of the video scope has a solid-state image sensor, such as a CCD (charge-coupled device) image sensor, provided at a distal end thereof, and is inserted in an organ of a human body for medical examination. To illuminate an object to be sensed by the CCD image sensor, the video scope includes a flexible optical light guide extending therethrough, and the optical light guide terminates at a light-radiating end face at the distal end of the flexible conduit section.

The rigid manipulating-section of the video scope is provided with manual handles for remotely bending a distal end portion of the flexible conduit section, to thereby control the orientation of the solid-state image sensor. Also, various manual switches are provided on the rigid manipulating-section.

The video scope also includes a cable extending from the rigid manipulating-section, and the cable contains electric wires extending from the CCD image sensor and the manual switches. The cable terminates at a connector section which is detachably coupled to the video-signal processing unit. The connector section comprises a housing including a circuit board on which various electronic devices are mounted to drive the CCD image sensor.

As one of the various electronic devices mounted on the circuit board, a digital signal processor (DSP) is known. The DSP is formed as a custom IC package for reading color image signals from the CCD image sensor. The DSP also processes the read color image signals, thereby producing a video signal. The video signal is fed to the video-signal processing unit in which the video signal is further processed to thereby produce a TV video signal, and then the TV video signal is fed to a TV monitor. Namely, the image sensed by the CCD image sensor is reproduced and displayed as a motion picture on a TV monitor.

In the electronic endoscope system, various types of video scope, such as a bronchial scope, an esophageal scope, a gastro scope, a colon scope, etc, are utilized, and thus the video scope is detachably coupled to the video-signal processing unit. Namely, the various types of video scope use the image-signal processing unit in common.

Also, in the electronic endoscope system, various types of video-signal processing unit are utilized. A representative type of video-signal processing unit is constituted such that a TV video signal is produced based on a first type of video signal composed of a luminance signal component, and two color-difference signal components. In another representative type of video-signal processing unit, a TV video signal is produced based on a second type of video signal composed of a luminance signal component and a color signal component. Thus, before the video scope can be utilized in either type of video-signal processing unit, the video scope must be constituted such that both the first type of video signal and the second type of video signal can be produced and output.

A plurality of wiring-patterns is previously arranged and formed on the circuit board such that either the first type of video signal or the second type of video signal can be selectively fed to the video-signal processing unit when the DSP is mounted on the circuit board. Namely, a part of the wiring-patterns is provided for feeding the first type of video signal to the video-signal processing unit, and the remaining part of the wiring-patterns is provided for feeding the second type of video signal to the video-signal processing unit.

Nevertheless, in reality, the first and second types of video signals cannot be directly fed to the video-signal processing unit, because each of the wiring-patterns is cut off at a suitable location. Namely, the first type of video signal cannot be fed to the video-signal processing unit until respective electrical connections are established at the cutoffs in the wiring-patterns for feeding the first type of video signal, and the second type of video signal cannot be fed to the video-signal processing unit until respective electrical connections are established at the cutoffs in the wiring-patterns for feeding the second type of video signal.

Thus, when the first type of video signal is fed to the video-signal processing unit, the wiring-patterns for feeding the second type of video signal remain as unused wiring-patterns on the circuit board. On the other hand, when the second type of video signal is fed to the video-signal processing unit, the wiring-patterns for feeding the first type of video signal remain as unused wiring-patterns on the circuit board. In this case, the unused wiring-patterns are partially supplied with either the first type of video signals or the second type of video signals, and thus may radiate noise because the video signals are similar to high frequency signals. Of course, the radiation of noise should be prevented in that an image reproduced on a TV monitor may be subjected to deterioration.

As an image-reproduction method for reproducing an image on the TV monitor, the NTSC, PAL, and SECAM methods are well known. In these case, it is necessary to regulate operational timing of the DSP in accordance with a series of basic clock pulse having a predetermined frequency according to the introduced image-reproduction method. Namely, the DSP includes various electronic circuits, each of which must be operated in accordance with a series of clock pulses having a given frequency which is derived from the frequency of the basic clock pulse. Thus, so that the DSP can be properly operated, it is necessary to prepare plural kinds of clock pulses having various frequencies which are derived from the frequency of the basic clock pulse.

Accordingly, the circuit board has an oscillator mounted thereon, and the oscillator is constituted so as to produce a series of basic clock pulse having a predetermined frequency according to an introduced image-reproduction method (NTSC, PAL, SECAM). Before the video scope can be adapted to at least two different image-reproduction methods, the circuit board must be provided with two respective oscillators which produce two different types of basic clock pluses having frequencies according to the different image-reproduction methods, and wiring-patterns must be formed on the circuit board such that one of the different types of basic clock pulse can be selectively utilized in accordance with an introduced image-reproduction method.

Thus, when only one of the two oscillators is utilized, a part of the wiring-patterns remains as an unused wiring-pattern on the circuit board. In this case, the unused wiring may be supplied with the basic clock pulse. When the unused wiring-pattern is supplied with the basic clock pulse, i.e. high frequent pulses, the unused wiring-pattern may form a noise-radiation source. As mentioned above the radiation of noise may deteriorate an image reproduced on the TV monitor.

SUMMARY OF THE INVENTION

Therefore, an object of the present invention is to provide a video scope utilized in an electronic endoscope system and containing a circuit board, in which an unused-wiring pattern, remaining on the circuit board, is treated such that radiation of noise from the unused wiring-pattern is reduced as much as possible.

In accordance with a first aspect of the present invention, there is provided a video scope utilized in an electronic endoscope system, which comprises: an image sensor; a circuit board; an electronic package mounted on the circuit board to process image signals, read from the image sensor, to thereby produce at least two types of video signal; and a wiring-pattern formed on the circuit board so as to extend from the electronic package, to thereby feed a video signal component, included in one of the two types of video signal, from the electronic package, the wiring-pattern being cut off at a suitable location. The video scope is characterized in that a portion of the wiring-pattern, which extends from the electronic package to the cutoff, is grounded to a ground layer of the circuit board through a suitable electric resistance when the wiring-pattern remains as an unused wiring-pattern on the circuit board.

Preferably, the portion of the wiring-pattern is grounded at the cutoff end. Also, the electronic package may comprise a digital signal processor which is constituted such that not only the processing of the image signals is performed but also the reading of the image signals from the image sensor is controlled.

According to a second aspect of the present invention, there is provided a video scope utilized in an electronic endoscope system, which comprises: an image sensor; a circuit board; an electronic package mounted on the circuit board to process image signals, read from the image sensor, to thereby produce at least two types of video signal; a connector mounted on the circuit board; and a wiring-pattern formed on the circuit board so as to be extend between the electronic package and the connector, to thereby feed a video signal component, included in one of the two types of video signal, from the electronic package to the connector, the wiring-pattern being cut off at two suitable locations. The video scope is characterized in that respective electrical connections are established at the cutoffs when the wiring-pattern is utilized.

In the second aspect of the present invention, preferably, one of the cutoffs is located in the vicinity of the electronic package. Also, the electronic package may comprise a digital signal processor which is constituted such that not only the processing of the image signals is performed but also the reading of the image signals from the image sensor is controlled.

According to the a third aspect of the present invention, there is provided a video scope utilized in an electronic endoscope system, which comprises: an image sensor; a circuit board; an electronic package mounted on the circuit board to process image signals, read from the image sensor, to thereby produce a video signal; a microcomputer mounted on the circuit board to control an operation of the electronic package; a first oscillator mounted on the circuit board to produce a first type of basic clock pulse; a second oscillator mounted on the circuit board to produce a second type of basic clock pulse; each of the first and second types of basic clock pulse being used to regulate an operational timing of the electronic package and the microcomputer; a first wiring-pattern formed on the circuit board to feed the first type of basic clock pulse from the first oscillator to the electronic package; a second wiring-pattern formed on the circuit board to feed the first type of basic clock pulse from the electronic package to the microcomputer, the second wiring-pattern being cut off at a suitable location; a third wiring-pattern formed on the circuit board and connected to the second wiring-pattern to feed the second type of basic clock pulse from the second oscillator to the microcomputer, the third wiring-pattern being cut off at a suitable location; and a fourth wiring-pattern formed on the circuit board to feed the second type of basic clock pulse from the microcomputer to the electronic package. The video scope is characterized in that a portion of the unused wiring-pattern, which extends from the microcomputer to the cutoff, is grounded to a ground layer of the circuit board though a suitable electric resistance when one of the first and second wiring-patterns remains as an unused wiring-pattern on the circuit board, In the third aspect of the present invention, preferably, the portion of the unused wiring-pattern is grounded at the cutoff end. Also, when the unused wiring-pattern is the second wiring-pattern, and when the second oscillator is operating, a portion of the second wiring-pattern, which extends from the microcomputer to the cutoff, is grounded to the ground layer of the circuit board through a suitable electric resistance. Further, when the unused wiring-pattern is the third wiring-pattern and when the first oscillator is operating, a portion of the third wiring-pattern, which extends from the second wiring-pattern to the cutoff, is grounded to the ground layer of the circuit board though a suitable electric resistance.

According to a fourth aspect of the present invention, there is provided a video scope utilized in an electronic endoscope system, which comprises: an image sensor; a circuit board; an electronic package mounted on the circuit board to process image signals, read from the image sensor, to thereby produce a video signal; a microcomputer mounted on the circuit board to control an operation of the electronic package; a first oscillator mounted on the circuit board to produce a first type of basic clock pulse; a second oscillator mounted on the circuit board to produce a second type of basic clock pulse; each of the first and second types of basic clock pulse being used to regulate operational timings of the electronic package and the microcomputer; a first wiring-pattern formed on the circuit board to feed the first type of basic clock pulse from the first oscillator to the electronic package; a second wiring-pattern formed on the circuit board to feed the first type of basic clock pulse from the electronic package to the microcomputer; a third wiring-pattern formed on the circuit board and connected to the second wiring-pattern to feed the second type of basic clock pulse from the second oscillator to the microcomputer; and a fourth wiring-pattern formed on the circuit board to feed the second type of basic clock pulse from the microcomputer to the electronic package. The video scope is characterized in that the second wiring-pattern is at least cut off at a location in the vicinity of the microcomputer, that the connection of the third wiring-pattern to the second wiring-pattern is established at a portion of the second wiring-pattern, which extends from the microcomputer to the cutoff, and that the third wiring-pattern is at least cut off a location of in the vicinity of the connection between the second wiring-pattern and the third wiring-pattern.

In the fourth aspect of the present invention, when the second wiring-pattern remains as an unused wiring-pattern on the circuit board, and when the first oscillator is operating, the second wiring-pattern is further cut off at a location in the vicinity of the electronic package. Also, when the third wiring-pattern remains as an unused wiring-pattern on the circuit board, and when the second oscillator is operating, the third wiring-pattern is further cut off at a location in the vicinity of the second oscillator.

In the third and fourth aspect of the present invention, the electronic package may comprise a digital signal processor which is constituted such that not only the processing of the image signals is performed but also the reading of the image signals from the image sensor is controlled.

BRIEF DESCRIPTION OF THE DRAWINGS

The object and other objects of the present invention will be better understood from the following description, referring to the accompanying drawings, in which.

DESCRIPTION OF THE PREFERRED EMBODIMENTS

Figure 1:
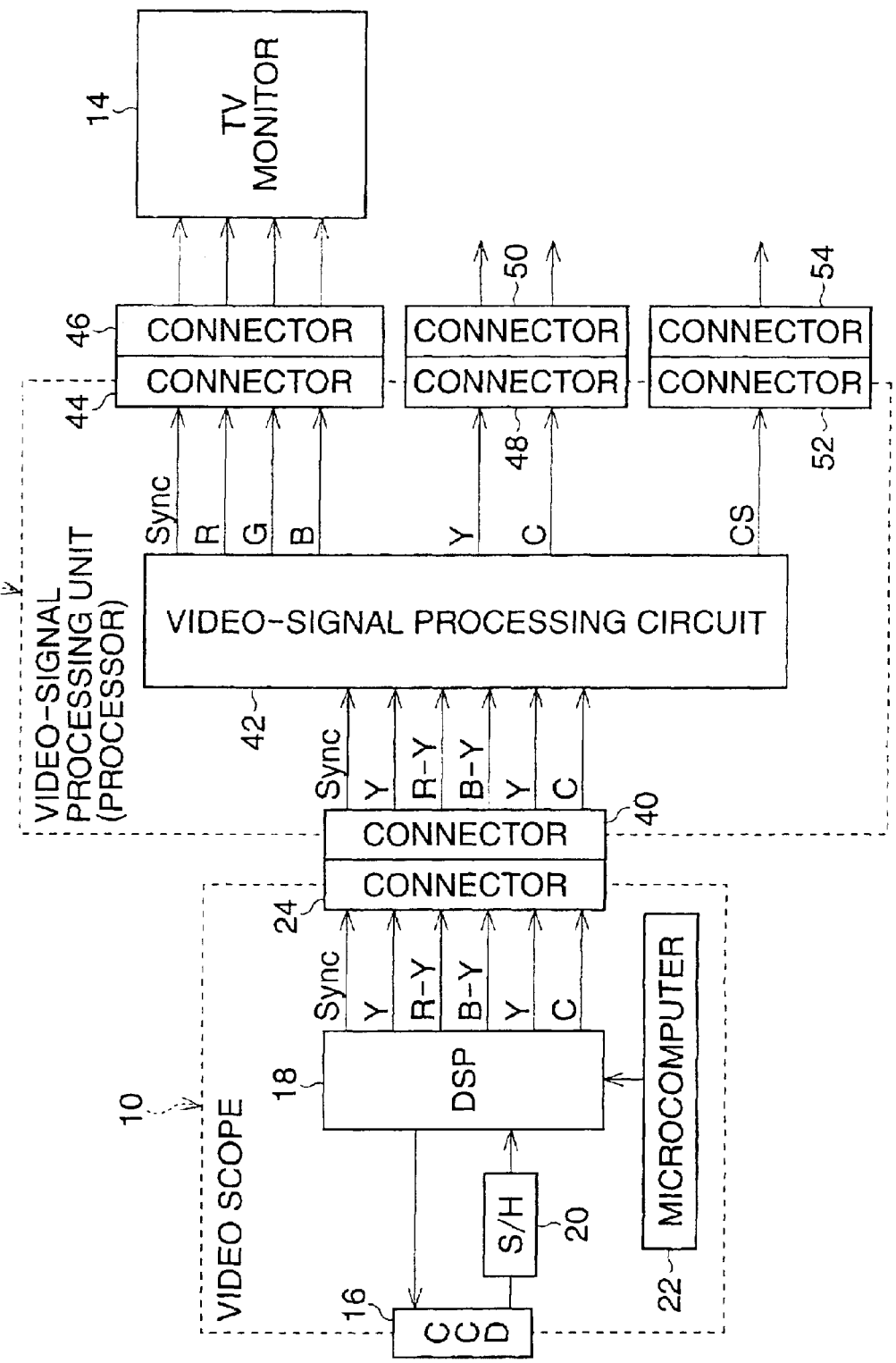
FIG. 1 is a schematic block diagram of an electronic endoscope system, in which a first embodiment of a video scope, according to the present invention is incorporated.

With reference to FIG. 1, an electronic endoscope system is schematically shown as a block diagram, in which a first embodiment of a video scope according to the present invention, generally indicated by reference 10, is incorporated. Namely, the video scope 10 forms a part of the electronic endoscope system, and the electronic endoscope system further comprises a video-signal processing unit or processor 12 to which the video scope is detachably coupled, and a TV monitor 14 connected to the video-signal processing unit 12.

The video scope 10 has a rigid manipulating-section, and a flexible conduit section extending from the rigid manipulating-section. The flexible conduit section of the video scope 10 has a solid-state image sensor 16, such as a CCD (charge-coupled device) image sensor, provided at a distal end thereof, and is inserted in an organ of a human body for medical examination. Although not illustrated, the video scope 10 includes a flexible optical light guide extending therethrough, and the optical light guide terminates at a light-radiating end face at the distal end of the flexible conduit section, thereby illuminating an object to be sensed by the CCD image sensor 16. In this first embodiment, the CCD image sensor 16 has a complementary color filter for converting an optical object image into a frame of color image signals.

Although not illustrated, the rigid manipulating-section of the video scope 10 is provided with manual handles for remotely bending the distal end portion of the flexible conduit section, to thereby control the orientation of the CCD image sensor 16. Also, various manual switches (not shown) are provided on the rigid manipulating-section.

The video scope 10 also includes a cable extending from the rigid manipulating-section, and the cable contains electric wires extending from the CCD image sensor 16 and the various manual switches. The cable terminates with a connector section which is detachably coupled to the video-signal processing unit 12. The connector section comprises a housing (not shown) including a circuit board (not shown in FIG. 1) on which various electronic elements are mounted to drive the CCD image sensor 16. In FIG. 1, a digital signal processor (DSP) 18, a sample-and-hold circuit (S/H) 20, a microcomputer 22, and a connector 24 are shown as representative electronic elements to be mounted on the circuit board. The DSP 18 is constituted as a custom IC package for reading color image signals from the CCD image sensor 16 and for processing the read color image signals, and is operated under control of the microcomputer 22.

In this embodiment, the DSP 18 produces two types of analog video signals based on the color image signals read from the CCD image sensor 16. One of the two types of analog video signals is referred to as a first type of analog video signal composed of a luminance signal component (Y), and two color-difference signal components (R-Y) and (B-Y); and the other is referred to as a second type of video signal composed of a luminance signal component (Y), and a color signal component (C).

Note, In FIG. 1, although the DSP 18 is illustrated as simultaneously outputting both the first type of analog video signal (Y, R-Y, B-Y) and the second type of analog video signal (Y, C) in reality, only one of the first type of analog video signal (Y, R-Y, B-Y) and the second type of analog video signal (Y, C) is fed from the DSP 18 to the connector 24, as will be discussed in detail hereinafter. In short, only one of the first type of analog video signal (Y, R-Y, B-Y) and the second type of analog video signal (Y, C) is output from the video scope 10 to the video-signal processing unit 12.

Figure 2:
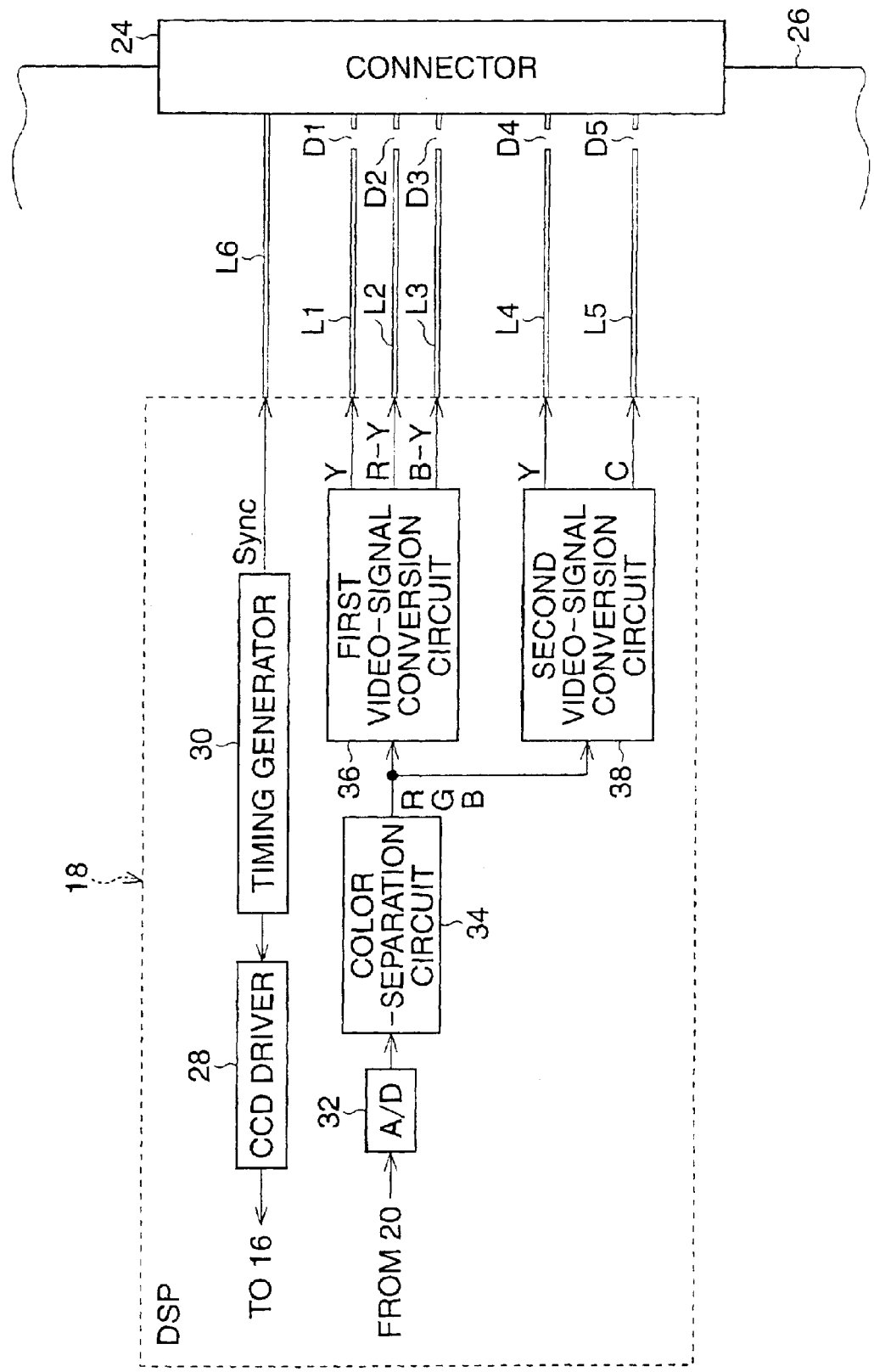
FIG. 2 is a partial view of a circuit board contained in the video scope of FIG. 1, showing a digital signal processor and a connector, mounted on the circuit board, as a schematic block diagram, together with an arrangement of wiring-patterns extending therebetween.

With reference to FIG. 2, the circuit board concerned is partially illustrated, and is indicated by reference 26. Also, in this drawing, the DSP 18 and the connector 24 are illustrated as being mounted on the circuit board 26.

Figure 11:
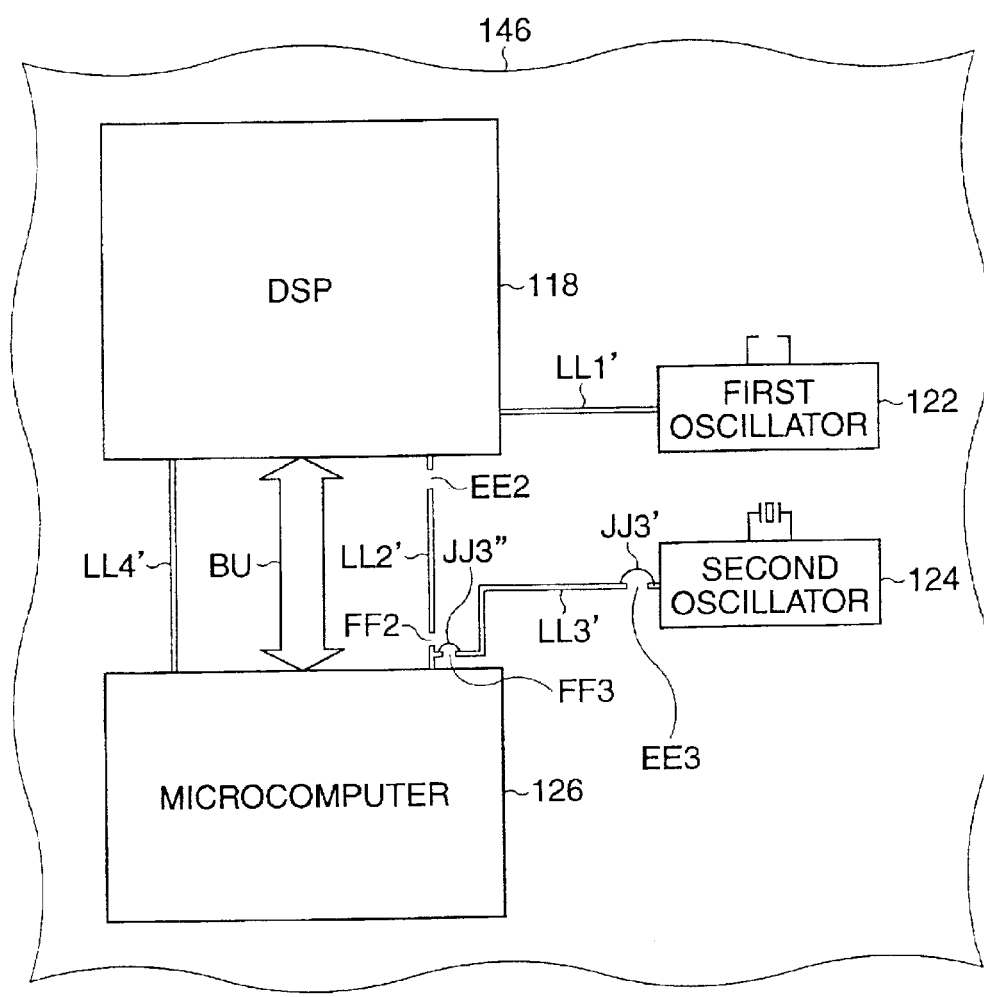
FIG. 11 is a view similar to FIG. 10, showing the treatment of a used wiring-patterns when the second oscillator is utilized.

As shown in FIG. 2, the DSP 18 includes a CCD driver 28 and a timing generator 30. The timing generator 30 produces a series of timing clock pulses having a given frequency, and then outputs to the CCD driver 28. Namely, the CCD driver 28 is operated in accordance with the timing clock pulses output from the timing generator 30, to thereby output a series of image-reading signals to the CCD image sensor 16. Thus, a frame or field of color image signals is successively read from the CCD image sensor 16 in accordance with the image-reading signals output from the CCD driver 28. As shown in FIG. 11, the read color image signals are fed to the S/H circuit 20, in which individual color image-pixel signals are extracted from the color image signals.

The DSP 18 further includes an analog-to-digital (A/D) converter 32, a color-separation circuit 34, a first video-signal conversion circuit 36, and a second video-signal conversion circuit 38. The color image-pixel signals, output from the S/H circuit 20, are fed to the A/D converter 32 in which the analog color image-pixel signals are converted into digital color image-pixel signals. Then, the digital color image-pixel signals are fed to the color-separation-circuit 34 in which the color image-pixel signals are successively processed to thereby produce three primary-color digital image-pixel signals: red digital image-pixel signals (R); green digital image-pixel signals (G); and blue digital image-pixel signals (B).

As shown in FIG. 2, the three primary-color digital image-pixel signals (R, G, B) are fed in parallel to both the first and second video-signal conversion circuits 36 and 38. In the first video-signal conversion circuit 36, the aforesaid first type of analog video signal (Y, R-Y, B-Y) is produced based on the three primary-color digital image-pixel signals (R, G, B). Also, in the second video-signal conversion circuit 38, the aforesaid second type of analog video signal (Y, C) is produced based on the three primary-color digital image-pixel signals (R, G, B).

As shown in FIG. 2, first, second, third, fourth, fifth wiring-patterns L1, L2, L3, L4, and L5 are previously formed on the circuit board 26 between a DSP-mounting area for the DSP 18 and a connector-mounting area for the connector 24. When the DSP 18 is properly mounted on the DSP-mounting area, predetermined output terminals of the DSP 18 are electrically connected to the respective wiring-patterns L1, L2, L3, L4, and L5. Also, when the connector 24 is properly mounted on the connector-mounting area, predetermined input terminals of the connector 24 are electrically connected to the respective wiring-patterns L1, L2, L3, L4, and L5.

The wiring-patterns L1, L2, and L3 are used to feed the first type of analog video signal (Y, R-Y, B-Y) from the first video-signal conversion circuit 36 to the connector 24. Namely, the respective first, second and third wiring-patterns L1, L2, and L3 are provided for feeding the luminance signal component (Y), and the color-difference signal components (R-Y) and (B-Y) of the first type of analog video signal (Y, R-Y, B-Y).

The wiring-patterns L4 and L5 are used to feed the second type of analog video signal (Y, C) from the second video-signal conversion circuit 38 to the connector 24. Namely, the respective fourth and fifth wiring-patterns L4 and L5 are provided for feeding the luminance signal component (Y) and the color signal component (C) of the second type of analog video signal (Y, C).

As is apparent from FIG. 2, in the production of the circuit board 26, all the wiring-patterns L1, L2, L3, L4, and L5 are intentionally cut off as indicated by references D1, D2, D3, D4, and D5, respectively. Thus, although the DSP 18 and the connector 24 are properly mounted on the circuit board 26, neither the first type of analog video signal (Y, R-Y, B-Y) or the second type of analog video signal (Y, C) can be fed to the connector 24.

Figure 3:
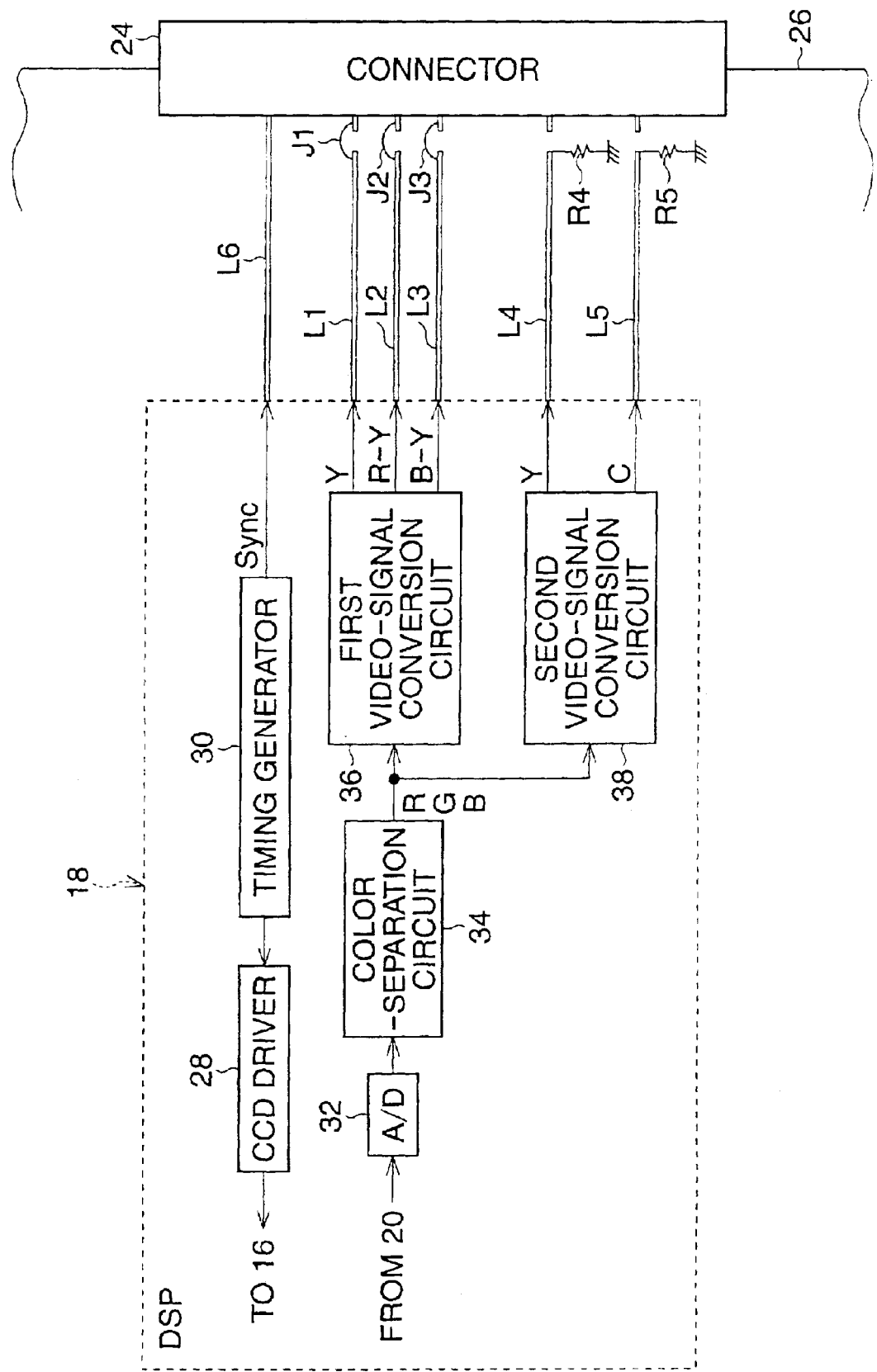
FIG. 3 is a view similar to FIG. 2, showing noise-reduction treatment of unused wiring-patterns left on the circuit board.

For example, when the video-signal processing unit 12 is designed so as to process the first type of analog video signal (Y, R-Y, B-Y), i.e. when the first type of analog video signal (Y, R-Y, B-Y) is utilized in the video-signal processing unit 12, respective electrical connections are established at the cutoffs D1, D2, and D3 with jumper wires J1, J2, and J3, as shown in FIG. 3. Optionally, the establishment of the electrical connections at the cutoffs D1, D2, and D3 may be carried out with solder drops. Thus, only the first type of analog video signal (Y, R-Y, B-Y) is fed from the first video-signal conversion circuit 36 to the connector 24.

Namely, the second type of analog video signal (Y, C) cannot be fed from the second video-signal conversion circuit 38 to the connector 24 when the video-signal processing unit 12 is provided for processing the first type of analog video signal (Y, R-Y, B-Y). In this case, the wiring-patterns L4 and L5 for the second video-signal conversion circuit 38 remain as unused wiring-patterns on the circuit board 26.

Nevertheless, the second video-signal conversion circuit 38 produces and outputs the luminance signal component (Y) and the color signal component (C) to the wiring-patterns L4 and L5 as long as the DSP 18 is operating. Namely, the respective wiring-patterns L4 and L5 are always supplied with the signal components (Y) and (C), i.e. high-frequency signals, and thus noise may be irradiated from the wiring-patterns L4 and L5. Thus, the unused wiring-patterns must be treated before the irradiation of noise can be prevented.

In this embodiment, to prevent the irradiation of noise, the respective cutoff ends of the wiring-patterns L4 and L5 are grounded to a ground layer of the circuit board 26 through the intermediary of suitable electric resistances R4 and R5. These electric resistances R4 and R5 are provided for impedance matching between the wiring-patterns L4 and L5 and the ground layer of the circuit board 26. Thus, the high frequency signals (Y, C) can easily escape from the wiring-patterns L4 and L5 to the ground layer of the circuit board 26 without being reflected at the grounded location, resulting in the effective prevention of the irradiation of noise from the wiring-patterns L4 and L5.

When the video-signal processing unit 12 is designed so as to process the second type of analog video signal (Y, C), i.e. when the second type of analog video signal (Y, C) is utilized in the video-signal processing unit 12, electrical connections are respectively established at the cutoffs D4 and D5 with jumper wires or solder drops. Thus, only the second type of analog video signal (Y, C) is fed from the second video-signal conversion circuit 38 to the connector 24. Of course, in this case, the first type of analog video signal (Y, R-Y, B-Y) cannot be fed from the first video-signal conversion circuit 36 to the connector 24. Namely, the wiring-patterns L1, L2, and L3 for the first video-signal conversion circuit 36 remain as unused wiring-patterns on the circuit board 26.

Nevertheless, the first video-signal conversion circuit 36 produces and outputs the luminance signal component (Y), and the color-difference signal components (R-Y, B-Y) to the wiring-patterns L1, L2, and L3 as long as the DSP 18 is operating. Namely, the respective wiring-patterns L1, L2, and L3 are always supplied with the signal components (Y) and (R-Y, B-Y), i.e. high-frequency signals, and thus noise may be irradiated from the wiring-patterns L1, L2, and L3.

Similar to the aforesaid case, to prevent the irradiation of noise, the respective cutoff ends of the wiring-patterns L1, L2, and L3 are grounded to the ground layer of the circuit board 26 through the intermediary of suitable electric resistances, which are provided for impedance matching between the wiring-patterns L1, L2, and L3 and the ground layer of the circuit board 26. Thus, the high-frequency signals (Y, R-Y, B-Y) can easily escape from the wiring-patterns L1, L2, and L3 to the ground layer of the circuit board 26 without being reflected at the grounded location, resulting in the effective prevention of the irradiation of noise from the wiring-patterns L1, L2, and L3.

As is apparent from FIG. 3, the timing generator 30 also produces a synchronizing signal (Sync) including a horizontal synchronizing signal component, a vertical synchronizing signal component, and so on, and the synchronizing signal (Sync) is output from the timing generator 30 to the connector 24 through a wiring-pattern L6 formed on the circuit board 26.

Again referring to FIG. 1, the video-signal processing unit 12 has a connector 40 to which the connector 26 is detachably coupled. Also, the video-signal processing unit 12 includes a video-signal processing circuit 42. In this embodiment, the video-signal processing circuit 42 is constituted so as to process either the first type of analog video signal (Y, R-Y, B-Y) or the second type of analog video signal (Y, C). Namely, if the video-signal processing circuit 42 is constituted so as to process the first type of analog video signal (Y, R-Y, B-Y), the video scope 10 is arranged so as to output both the synchronizing signal (Sync) and the first type of analog video signal (Y, R-Y, B-Y). If the video-signal processing circuit 42 is constituted so as to process the second type of analog video signal (Y, C), the video scope 10 is arranged so as to output both the synchronizing signal (Sync) and the second type of analog video signal (Y, C).

In the video-signal processing circuit 42 shown in FIG. 1 by way of example, three types of TV video signals are produced based on either the first type of analog video signal (Y, R-Y, B-Y) or the second type of analog video signal (Y, C). Namely, a first type of TV video signal is a component video signal composed of a synchronizing signal component (Sync), a red video signal component (R), a green video signal component (G), and a blue video signal component (B); a second type of TV video signal is a Y/C video signal (S-video signal) composed of a luminance signal component (Y), and a color signal component (C); and a third type of TV video signal is a composite color video signal (CS).

The component video signal (Sync, R, G, B) is fed to the TV monitor 14 through coupled connectors 44 and 46. Namely, an endoscope image, sensed by the CCD image sensor 16, is reproduced as a motion picture on the TV monitor 14 in accordance with the component video signal (Sync, R, G, B). Either the Y/C video signal or the composite color video signal (CS) is suitably utilized, if necessary. For example, the Y/C video signal is fed to another TV monitor or a piece of peripheral equipment, such as a video tape recorder, a video printer or the like, through coupled connectors 48 and 50. The composite color video signal (CS) is also fed to another TV monitor or a piece of peripheral equipment, such as a video tape recorder, a video printer or the like, through coupled connectors 52 and 54.

Figure 4:
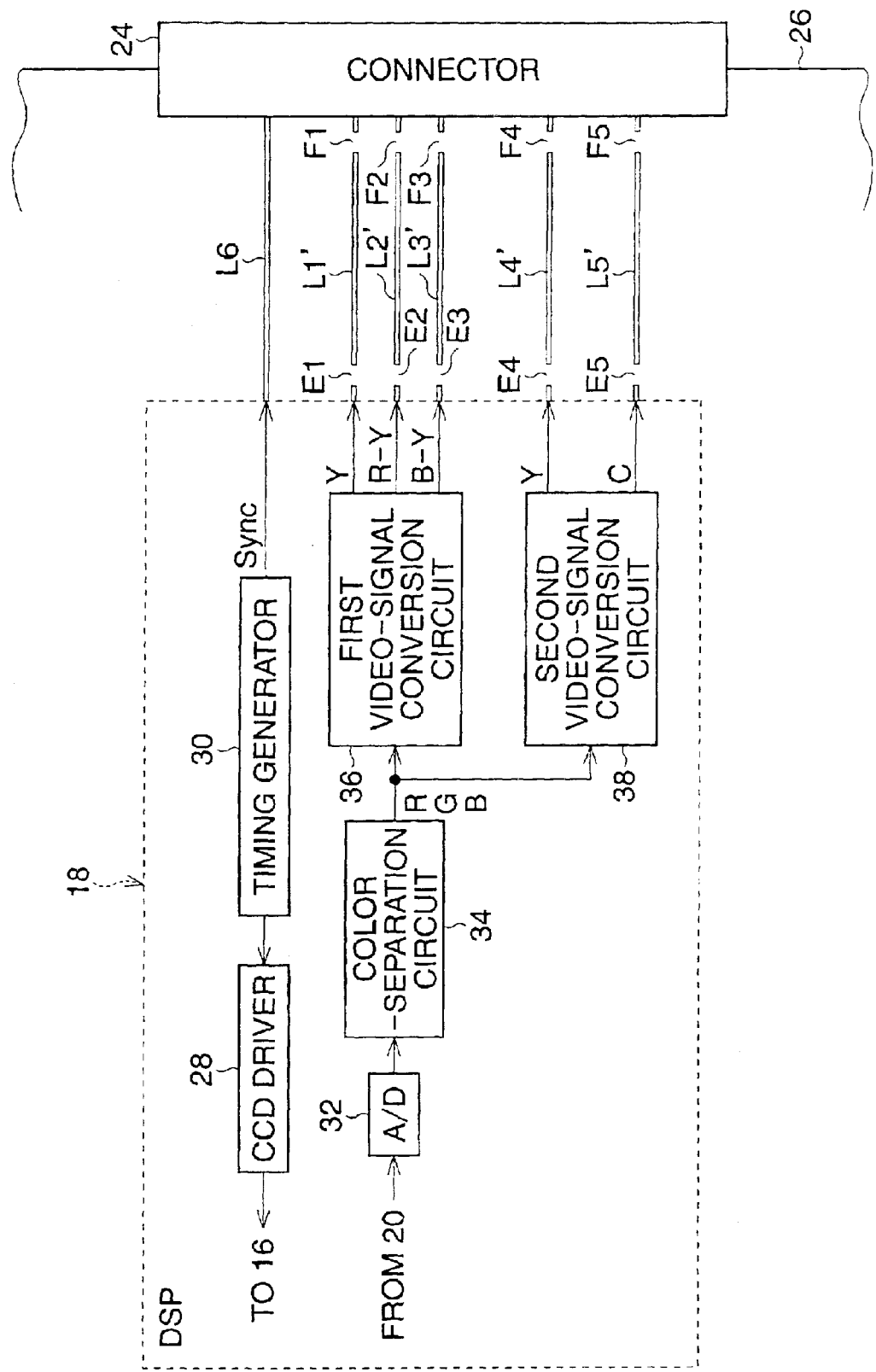
FIG. 4 is a view similar to FIG. 2, showing another arrangement of wiring-patterns for noise-reduction treatment of unused wiring-patterns left on the circuit board.

FIG. 4 shows another treatment of the unused wiring-patterns in the first embodiment. Note, in FIG. 4, the elements similar to those of FIG. 3 are indicated by the same references.

Similar to the case of FIG. 3, in FIG. 4, the first, second, and third wiring-patterns, indicated by references L1', L2', and L3', have been previously formed on the circuit board 26 to feed the first type of analog video signal (Y, R-Y, B-Y) from the DSP 18 to the connector 24. Also, the fourth and fifth wiring-patterns, indicated by references L4' and L5', are previously formed on the circuit board 26 to feed the second type of analog video signal (Y, C) from the DSP 18 to the connector 24. The respective wiring-patterns L1', L2', L3', L4', and L5' are cut off at two locations in the vicinity of the DSP 18 and the connector 24, as indicated by references E1 and F1; E2 and F2; E3 and F3; E4 and F4; and E5 and F5.

When the video-signal processing unit 12 is designed so as to process the first type of analog video signal (Y, R-Y, B-Y), i.e. when the first type of analog video signal (Y, R-Y, B-Y) is utilized in the video-signal processing unit 12, respective electrical connections are established at the cutoffs E1 and F1; E2 and F2; and E3 and F3 with either jumper wires or solder drops. Thus, only the first type of analog video signal (Y, R-Y, B-Y) is fed from the first video-signal conversion circuit 36 to the connector 24.

In this case, the wiring-patterns L4' and L5' for the second video-signal conversion circuit 38 remain as unused wiring-patterns on the circuit board 26. Nevertheless, radiation of noise from the unused wiring-patterns L4' and L5' can be considerably reduced, because the greater part of each wiring-patter (L4', L5') cannot be supplied with the high frequency signal(Y or C) due to the existence of the two cutoffs (E4 and F4 or E5 and F5) in the vicinity of the DSP 18 and the connector 24.

In FIG. 4, when the video-signal processing unit 12 is designed so as to process the second type of analog video signal (Y, C), i.e. when the second type of analog video signal (Y, C) is utilized in the video-signal processing unit 12, respective electrical connections are established at the cutoffs E4 and F4; and E5 and F5 with either jumper wires or solder drops. Thus, only the second type of analog video signal (Y, C) is fed from the second video-signal conversion circuit 38 to the connector 24.

In this case, the wiring-patterns L1', L2', and L3' for the first video-signal conversion circuit 36 remain as unused wiring-patterns on the circuit board 26. Nevertheless, radiation of noise from the unused wiring-patterns L1', L2', and L3' can be considerably reduced, because the greater part of each wiring-patter (L1', L2', L3') cannot be supplied with the high frequency signal(Y, R-Y or B-Y) due to the existence of the two cutoffs (E1 and F1; E2 and F2 or E3 and F3) in the vicinity of the DSP 18 and the connector 24.

Figure 5:
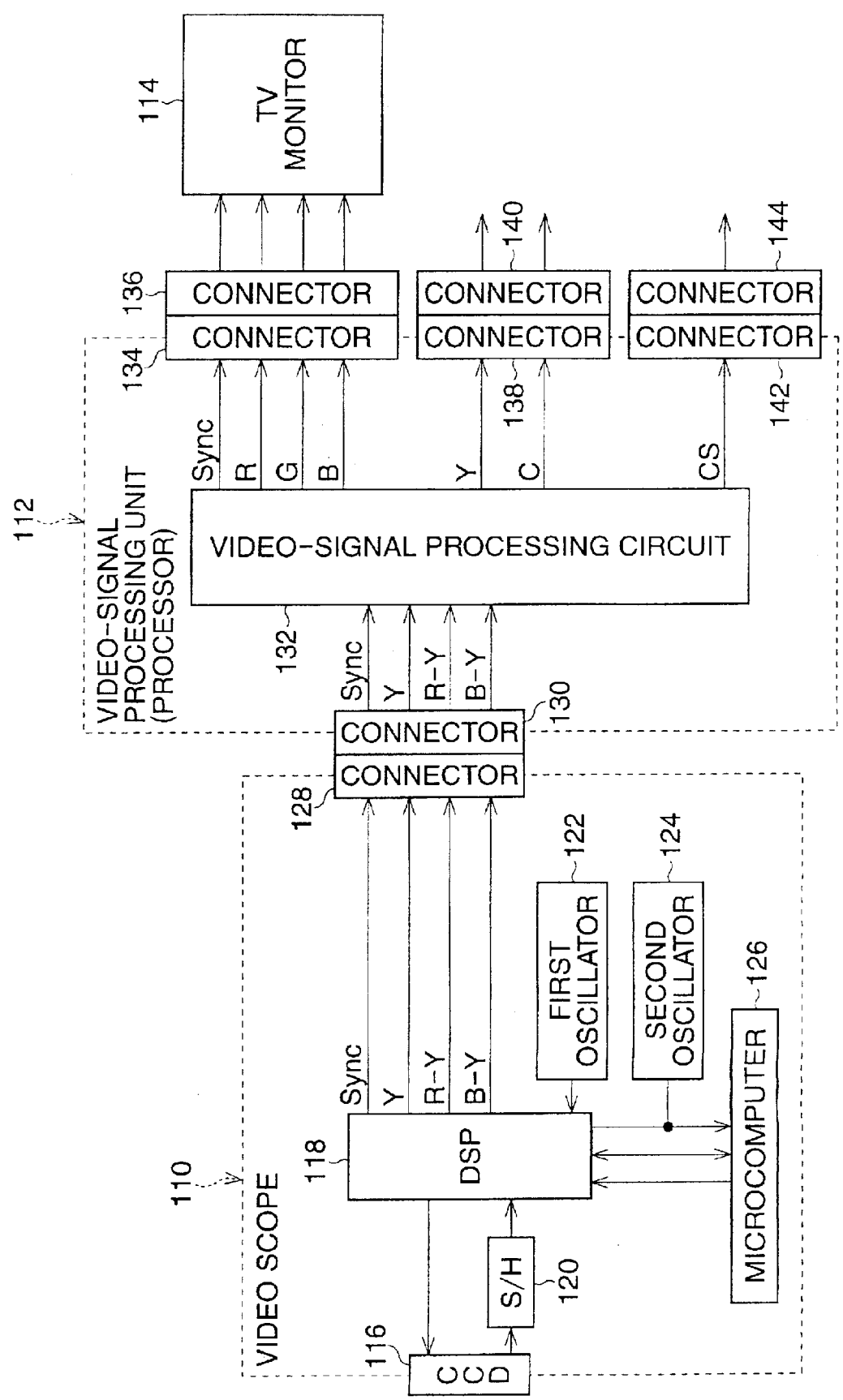
FIG. 5 is a schematic block diagram of an electronic endoscope system, in which a second embodiment of a video scope according to the present invention is incorporated.

With reference to FIG. 5, an electronic endoscope system is schematically shown as a block diagram, in which a second embodiment of a video scope according to the present invention, generally indicated by reference 110, is incorporated. Namely, the video scope 110 forms a part of the electronic endoscope system, and the electronic endoscope system further comprises a video-signal processing unit or processor 112 to which the video scope is detachably coupled, and a TV monitor 114 connected to the video-signal processing unit 112.

Similar to the first embodiment, the video scope 110 has a rigid manipulating-section, and a flexible conduit section extending from the rigid manipulating-section. The flexible conduit section of the video scope 110 has a solid-state image sensor 116, such as a CCD (charge-coupled device) image sensor, provided at a distal end thereof, and is inserted in an organ of a human body for medical examination. Although not illustrated, the video scope 110 includes a flexible optical light guide extending therethrough, and the optical light guide terminates at a light-radiating end face at the distal end of the flexible conduit section, thereby illuminating an object to be sensed by the CCD image sensor 116. In this second embodiment, the CCD image sensor 116 also has a complementary color filter for converting an optical object image into a frame of color image signals.

Although not illustrated, the rigid manipulating-section of the video scope 110 is provided with manual handles for remotely bending the distal end portion of the flexible conduit section, to thereby control the orientation of the CCD image sensor 116. Also, various manual switches (not shown) are provided on the rigid manipulating-section.

The video scope 110 also includes a cable extending from the rigid manipulating-section, and the cable contains electric wire lines extending from the CCD image sensor 116 and the various manual switches. The cable terminates with a connector section which is detachably coupled to the video-signal processing unit 112. The connector section comprises a housing (not shown) including a circuit board (not shown in FIG. 5) on which various electronic elements are mounted to drive the CCD image sensor 116. In FIG. 5, a digital signal processor (DSP) 118, a sample-and-hold circuit (S/H) 120, a first oscillator 122, a second oscillator 124, a microcomputer 126, and a connector 128 are shown as representative electronic elements to be mounted on the circuit board.

The DSP 118 is constituted as a custom IC package for reading color image signals from the CCD image sensor 116 and for processing the read color image signals, and is operated under the control of the microcomputer 126. The DSP 118 includes various electronic circuits, each of which is operated in accordance with a series of clock pulses having a given frequency. Namely, before the DSP 118 can be properly operated, it necessary to prepare plural kinds of clock pulses having various frequencies.

In the second embodiment, the plural kinds of clock pulses having the various frequencies are produced from a series of basic clock pulse having a predetermined frequency, which is output from either the first oscillator 122 or the second oscillator 124. Namely, by suitably dividing the predetermined frequency of the basic clock pulses, it is possible to obtain the plural kinds of clock pulses having the various frequencies. Each of the first and second oscillators 122 and 124 may be formed as a quartz oscillator. The first quartz oscillator 122 outputs a first type of basic clock pulse having a frequency according to the NTSC method, and the second quartz oscillator 124 outputs a second type of basic clock pulse having a frequency according to the PAL method. Note, the microcomputer 126 is also operated in accordance with either the first type of basic clock-pulse or the second type of basic clock pulse output from the first oscillator 122 and the second oscillator 124.

The DSP 118 produces and outputs a series of image-reading signals to the CCD image sensor 116, and a frame or field of color image signals is successively read from the CCD image sensor 116 in accordance with the image-reading signals. The read color-image signals are fed to the S/H circuit 120, in which individual color image-pixel signals are extracted from the color image signals, and the extracted color image-pixel signals are fed to the DSP 118. In the DSP 118, the color image-pixel signal are converted into digital color image-pixel signals, and the digital color image-pixel signals are successively processed to thereby produce three primary-color digital image-pixel signals: red digital image-pixel signals (R); green digital image-pixel signals (G); and blue digital image-pixel signals (B). In this embodiment, the three primary-color digital image-pixel signals (R, G, B) are further processed to thereby produce a digital video signal composed of a digital luminance signal component (Y), and two digital color-difference signal components (R-Y) and (B-Y), and the digital video signal (Y, R-Y, B-Y) is then converted into an analog video signal. On the other hand, the DSP 118 produces a synchronizing signal (Sync), and the analog video signal (Y, R-Y, B-Y) is output together with the synchronizing signal (Sync) from the DSP 1118 to the connector 128.

As shown in FIG. 1, the video-signal processing unit 112 has a connector 130 to which the connector 128 is detachably coupled. Also, the video-signal processing unit 112 includes a video-signal processing circuit 132. In the second embodiment, the video-signal processing circuit 132 is constituted so as to process the analog video signal (Y, R-Y, B-Y) to thereby produce three types of TV video signals: a component video signal composed of a synchronizing signal component (Sync), a red video signal component (R), a green video signal component (G), and a blue video signal component (B); a Y/C video signal (S-video signal) composed of a luminance signal (Y), and a color video signal (C); and a composite color video signal (CS).

The component video signal (Sync, R, G, B) is fed to the TV monitor 114 through coupled connectors 134 and 136. Namely, an endoscope image, sensed by the CCD image 116, is reproduced as motion picture on the TV monitor 114 in accordance with the component video signal (Sync, R, G, B). Similar to the case of FIG. 5, either the Y/C video signal or the composite color video signal (CS) is suitably utilized, if necessary. Namely, the Y/C video signal is fed to another TV monitor or a piece of peripheral equipment, such as a video tape recorder, a video printer or the like, through coupled connectors 138 and 140. The composite color video signal (CS) is also fed to another TV monitor or a piece of peripheral equipment, such as a video tape recorder, a video printer or the like, through coupled connectors 142 and 144.

Figure 6:
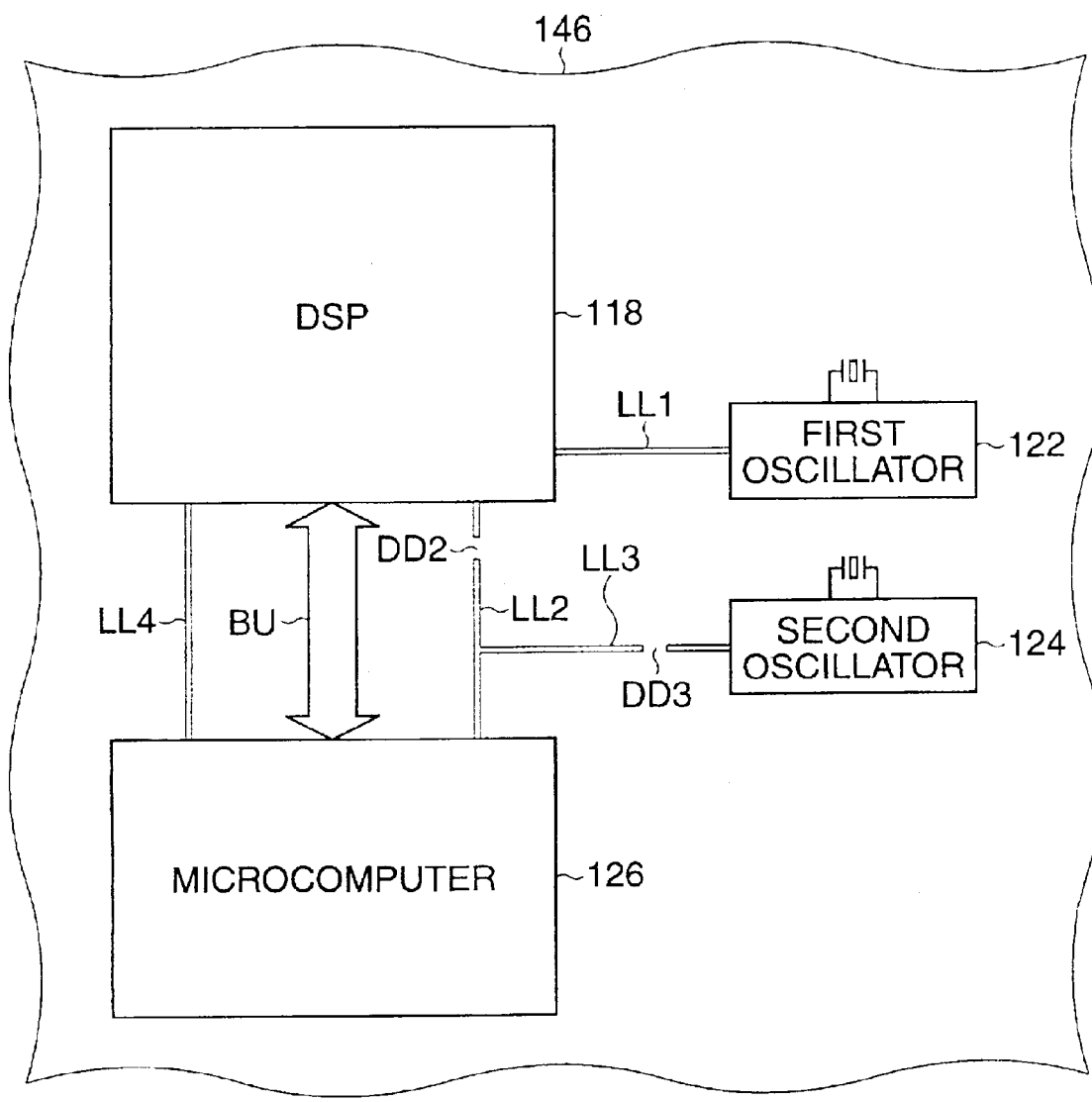
FIG. 6 is a partial view of a circuit board contained in the video scope of FIG. 5, showing a digital signal processor, a microcomputer, and first and second oscillators, mounted on the circuit board, as a schematic block diagram, together with an arrangement of wiring-patterns extending therebetween.

With reference to FIG. 6, the circuit board, provided in the connector section of the cable extending from the endoscope 110, is partially illustrated, and is indicated by reference 146. Also, in FIG. 6, the DSP 118, the first and second oscillators 122 and 124, and the microcomputer 126 are illustrated as being mounted on the circuit board 146. The DSP 18 is formed as a custom IC package, and is mounted at a DSP-mounting area defined on the circuit board 146. Also, each of the first and second oscillators 122 and 124 is formed as an electronic device, and the respective first and second oscillators 122 and 124 are mounted at oscillator-mounting areas defined on the circuit board 146. Further, the microcomputer 126 is formed as an electronic package, and is mounted at a microcomputer-mounting area defined on the circuit board 146.

As shown in FIG. 6, first, second, third, and fourth wiring-patterns LL1, LL2, LL3, and LL4 are previously formed on the circuit board 146. The first wiring-pattern LL1 is extended between the DSP 118 and the first oscillator 122 to feed the first type of basic clock pulse from the first oscillator 122 to the DSP 118. The second wiring-pattern LL2 is extended between the DSP 118 and the microcomputer 126 to feed the first type of basic clock pulse from the first oscillator 122 to the microcomputer 126 through the DSP 118. The third wiring-patter LL3 is extended between the second wiring-pattern LL2 and the second oscillator 124 to feed the second type of basic clock pulse from the second oscillator 124 to the microcomputer 126. The fourth wiring-pattern LL4 is extended between the DSP 118 and the microcomputer 126 to feed the second type of basic clock pulse from the second oscillator 124 to the DSP 118 through the microcomputer 126.

As shown in FIG. 6, in the production of the circuit board 146, the second wiring-pattern LL2 is intentionally cut off as indicated by reference DD2, and the third wiring-pattern LL3 is intentionally cut off as indicated by reference DD3.

Further, a plurality of wiring-patterns are formed on the circuit board 146 between the DSP 118 and the microcomputer 126 for communication therebetween. In FIG. 6, the plurality of wiring-patterns are represented by a bus BU. Note, in reality, although other wiring-patterns may be formed on the circuit board 146, the other wiring-patterns are omitted from FIG. 6, because the other wiring-patterns are not directly related to the present invention.

Figure 7:
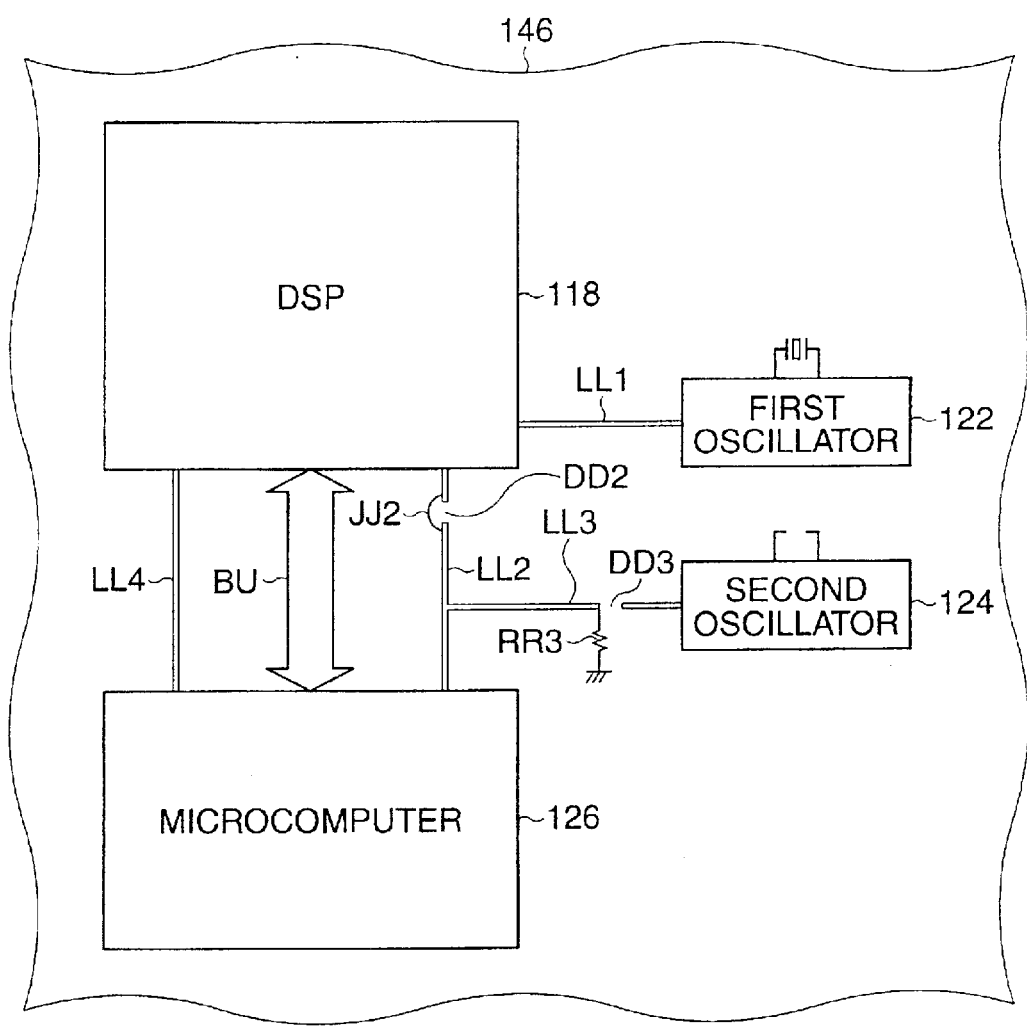
FIG. 7 is a view similar to FIG. 6, showing noise-reduction treatment of unused wiring-patterns when the first oscillator is utilized.

When the NTSC method is introduced in the video scope 110, the DSP 118 and the microcomputer 126 must be operated in accordance with the first type of basic clock pulse output from the first oscillator 122. Namely, the first oscillator 122 is necessary, but the second oscillator 124 is unnecessary. In this case, an electrical connection is established at the cutoff DD2 with a jumper wire JJ2, as shown in FIG. 7. Optionally, the establishment of the electrical connection at the cutoff DD2 may be carried out with a solder drop. Thus, it is possible to operate the DSP 118 and the microcomputer 126 in accordance with the first type of basic clock pulse output from the first oscillator 122.

Accordingly, when the NTSC method is introduced in the video scope 110, the third wiring-pattern LL3 remains as an unused wiring-pattern on the circuit board 146. In this case, as is apparent from FIG. 7, a portion of the third wiring-pattern LL3, which extends between the second wiring-pattern LL2 and the cutoff DD3, is always supplied with the first type of basic clock pulse, and thus noise may be irradiated from that portion of the third wiring-pattern LL3. Thus, the unused wiring-pattern must be treated before the irradiation of noise can be prevented.

To prevent the irradiation of noise, as shown in FIG. 7, the cutoff end of the third wiring-patterns LL3, supplied with the first type of basic clock pulse, is grounded to a ground layer of the circuit board 146 through the intermediary of a suitable electric resistance RR3, which is provided for impedance matching between the aforesaid portion of the third wiring-pattern LL3 and the ground layer of the circuit board 146. Thus, the first type of basic clock pulse can easily escape from the aforesaid portion of the third wiring-pattern LL3 to the ground layer of the circuit board 146 without being reflected at the grounded location, thereby effectively preventing the irradiation of noise from the aforesaid portion of the third wiring-pattern LL3.

Also, when the NTSC method is introduced in the video scope 110, the quartz may be removed from the second oscillator 124, as shown in FIG. 7. In this case, an internal circuit of the second oscillator 124 is grounded to the ground layer of the circuit board 146. Thus, it is possible to completely prevent radiation of noise from the remaining portion of the third wiring-pattern LL3 which extends from the second oscillator 124 to the cutoff DD3.

While the first oscillator 122 is operating, the second oscillator 124 may be operating, whereby the NTSC method can be quickly switched to the PAL method in the video scope 110. In this case, since the remaining portion of the third wiring-pattern LL3 is always supplied with the second type of basic clock pulse output from the second oscillator 124, the cutoff end of the remaining portion of the third wiring-pattern LL3 must be grounded to the ground layer of the circuit board 146 though the intermediary of a suitable electric resistance.

On the other hand, when it has been previously ascertained that the PAL method is not needed into the video scope 110, it is unnecessary to mount the second oscillator 124. Nevertheless, the third wiring-pattern LL3 must be subjected to the aforesaid noise-radiation-prevention treatment, because the third wiring-pattern LL3 has been previously formed on the circuit board 146.

Figure 8:
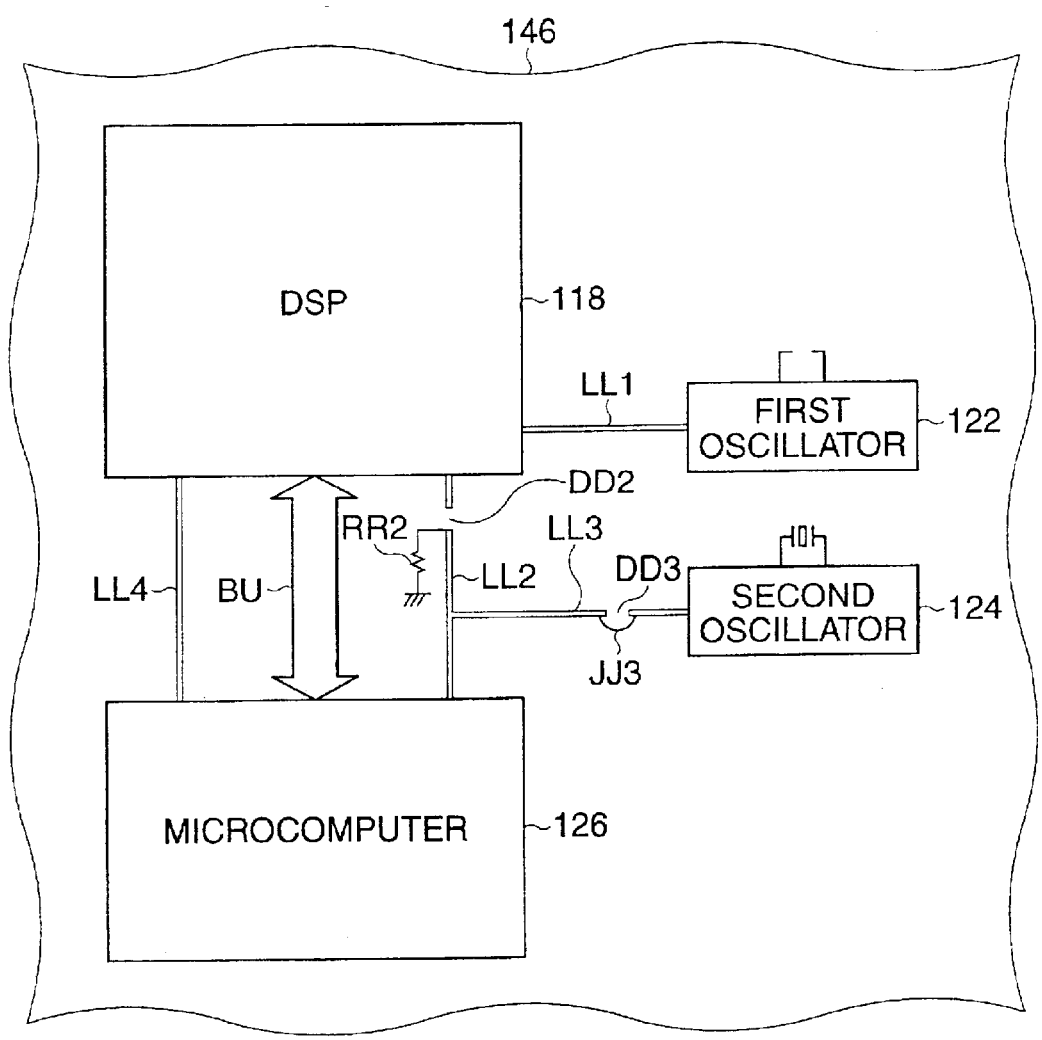
FIG. 8 is a view similar to FIG. 7, showing noise-reduction treatment of unused wiring-patterns when the second oscillator is utilized.

When the PAL method is introduced in the video scope 110, the DSP 118 and the microcomputer 126 must be operated in accordance with the second type of basic clock pulse output from the second oscillator 124. Namely, the second oscillator 124 is necessary, but the first oscillator 122 is unnecessary. In this case, an electrical connection is established at the cutoff DD3 with a jumper wire JJ3, as shown in FIG. 8. Optionally, the establishment of the electrical connection at the cutoff DD3 may be carried out with a solder drop. Thus, it is possible to operate the DSP 118 and the microcomputer 126 in accordance with the second type of basic clock pulse output from the second oscillator 124. Note, as is apparent from the foregoing, the second type of basic clock pulse is fed from the microcomputer 126 to the DSP 118 through the fourth wiring-pattern LL4.

Accordingly, when the PAL method is used in the video scope 110, the second wiring-pattern LL2 partially remains as an unused wiring-pattern on the circuit board 146. In this case, as is apparent from FIG. 8, a portion of the second wiring-pattern LL2, which extends between the cutoff DD2 and the location at which the third wiring-pattern LL3 is connected to the second wiring-pattern LL2, is always supplied with the second type of basic clock pulse, and thus noise may be irradiated from that portion of the second wiring-pattern LL2. Thus, it is necessary to treat the unused wiring-pattern before the irradiation of noise can be prevented.

To prevent the irradiation of noise, as shown in FIG. 8, the cutoff end of the second wiring-patterns LL2, supplied with the second type of basic clock pulse, is grounded to the ground layer of the circuit board 146 through the intermediary of a suitable electric resistance RR2, which is provided for impedance matching between the aforesaid portion of the third wiring-pattern LL3 and the ground layer of the circuit board 146. Thus, the second type of basic clock pulse can easily escape from the aforesaid portion of the second wiring-pattern LL2 to the ground layer of the circuit board 146 without being reflected at the grounded location, thereby effectively preventing the irradiation of noise from the aforesaid portion of the second wiring-pattern LL2.

Also, when the PAL method is introduced in the video scope 110, the quartz may be removed from the first oscillator 122, as shown in FIG. 8. In this case, an internal circuit of the first oscillator 122 is grounded to the ground layer of the circuit board 146. Thus, it is possible to completely prevent radiation of noise from the remaining portion of the second wiring-pattern LL2 which extends from the DSP 118 to the cutoff DD2.

While the second oscillator 124 is operating, the first oscillator 122 may be operating, whereby the PAL method can be quickly switched to the NTSC method in the video scope 110. In this case, since the remaining portion of the second wiring-pattern LL2 is always supplied with the first type of basic clock pulse output from the first oscillator 122, the cutoff end of the remaining portion of the second wiring-pattern LL2 must be grounded to the ground layer of the circuit board 146 though the intermediary of a suitable electric resistance.

On the other hand, when it has been previously ascertained that the NTSC method is not needed in the video scope 110, it is unnecessary to mount the first oscillator 122. Nevertheless, the second wiring-pattern LL2 must be subjected to the aforesaid noise-radiation-prevention treatment, because the second wiring-pattern LL2 has been previously formed on the circuit board 146.

Note, in order to feed the second type of basic clock pulse from the second oscillator 124 to the microcomputer 126, although the third wiring-pattern LL3 is connected to the second wiring-pattern LL2 (FIGS. 6, 7, and 8), it may be directly connected to the microcomputer 126.

Figure 9:
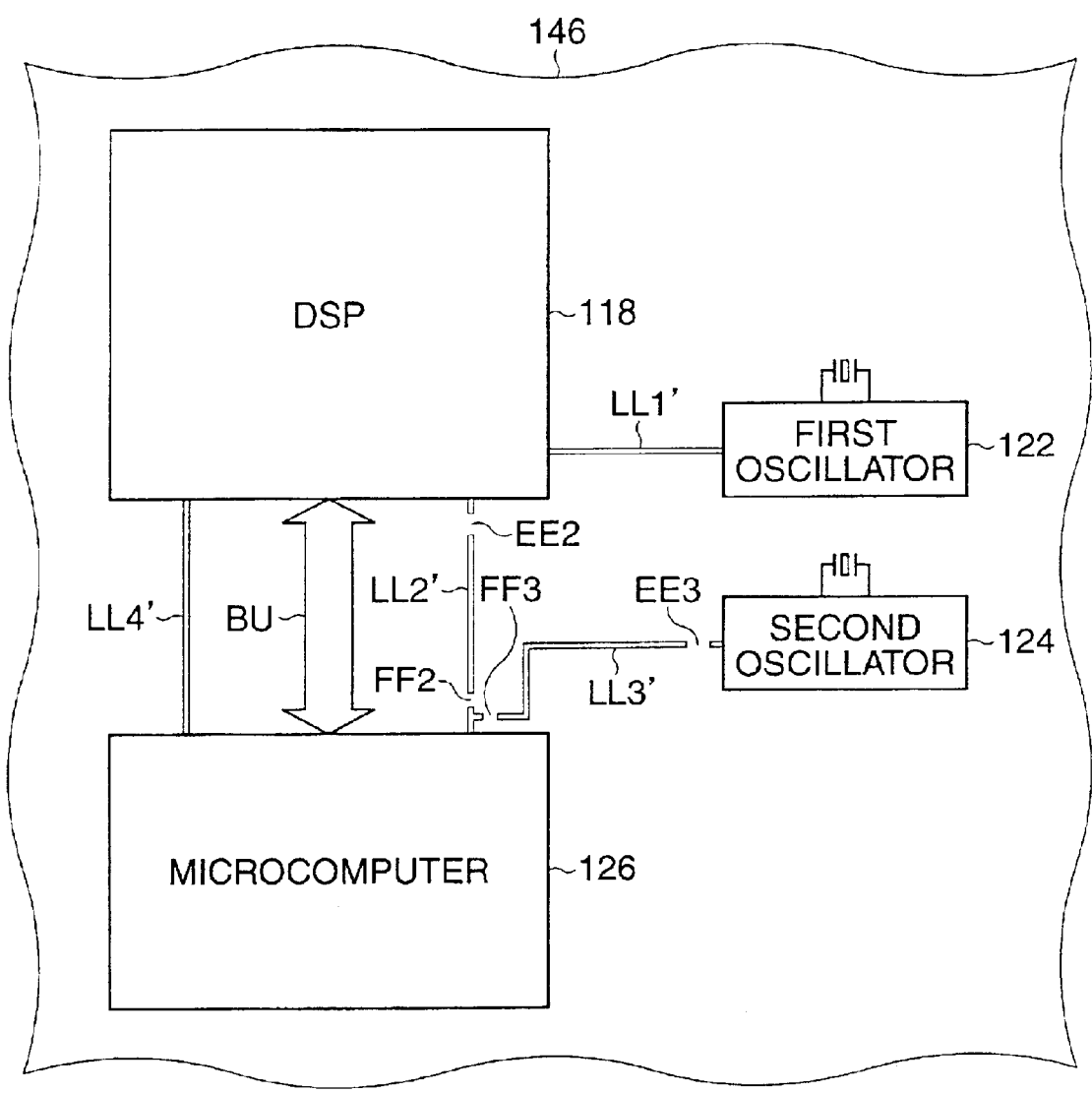
FIG. 9 is a view similar to FIG. 6, showing another arrangement of wiring-patterns for noise-reduction treatment, extending between the digital signal processor, the microcomputer, and the first and second oscillators.

FIG. 9 shows another treatment of the unused wiring-patterns in the second embodiment. Note, in FIG. 9, the elements similar to those of FIG. 6 are indicated by the same references.

Similar to the case of FIG. 6, in FIG. 9, the first, second, third, and fourth wiring-patterns, indicated by references LL1', LL2', LL3', and LL4', have been previously formed on the circuit board 26. The first wiring-pattern LL1' is provided for feeding the first type of basic clock pulse from the first oscillator 122 to the DSP 118. The second wiring-pattern LL2' is provided for feeding the first type of basic clock pulse from the first oscillator 122 to the microcomputer 126 through the DSP 118. The third wiring-pattern LL3' is provided for feeding the second type of basic clock pulse from the second oscillator 124 to the microcomputer 126, and is connected to the second writing-pattern LL2' in the vicinity of the microcomputer 126. The fourth wiring-pattern LL4' is provided for feeding the second type of basic clock pulse from the second oscillator 124 to the DSP 118 through the microcomputer 126.

As shown in FIG. 9, in the production of the circuit board 146, the second wiring-patterns LL2' is intentionally cut off at two locations in the vicinity of the DSP 118 and the microcomputer 126, as indicated by references EE2 and FF2. Further, the third wiring-pattern LL3' is intentionally cut off at two locations in the vicinity of the second oscillator 124 and at the location where the third wiring-pattern LL3' is connected to the second wiring-pattern LL2', as indicated by references EE3 and FF3.

Figure 10:
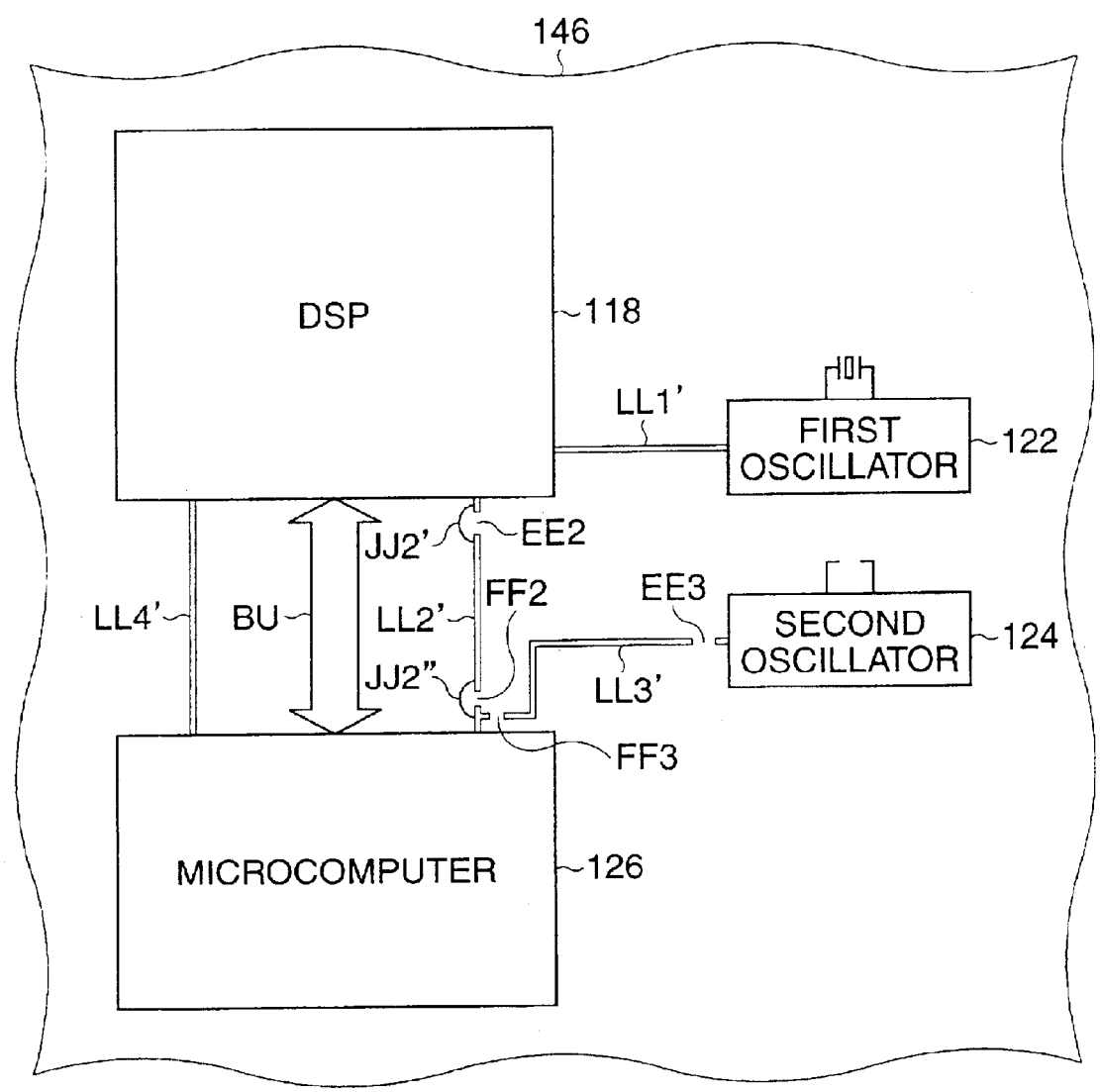
FIG. 10 is a view similar to FIG. 9, showing the treatment of a used wiring-pattern when the first oscillator is utilized.

When the NTSC method is introduced in the video scope 110, the DSP 118 and the microcomputer 126 must be operated in accordance with the first type of basic clock pulse output from the first oscillator 122. Namely, the first oscillator 122 is necessary, but the second oscillator 124 is unnecessary. In this case, respective electrical connections are established at the cutoffs EE2 and FF2 with jumper wires JJ2' and JJ2", as shown in FIG. 10. Optionally, the establishment of the electrical connections at the cutoffs EE2 and FF2 may be carried out with solder drops. Thus, it is possible to operate the DSP 118 and the microcomputer 126 in accordance with the first type of basic clock pulse output from the first oscillator 122.

Accordingly, when the NTSC method is introduced in the video scope 110, the third wiring-pattern LL3 remains as an unused wiring-pattern on the circuit board 146. Nevertheless, radiation of noise from the unused wiring-pattern LL3' can be considerably reduced, because the greater part of the unused wiring-pattern LL3' cannot be supplied with the first type of basic clock pulse due to the existence of the two cutoffs EE3 and FF3. Namely, a very small portion of the third wiring-pattern, which extends from the second wiring-pattern LL2' to the cutoff FF3, is only supplied with the first type of basic clock pulse.

When the NTSC method is introduced in the video scope 110, the quartz may be removed from the second oscillator 124, as shown in FIG. 10. If the removal of the quartz from the second oscillator 124 is ensured upon introducing the NTSC method in the video scope 110, it is unnecessary to form the cutoff EE3 in the third wiring-pattern LL3'.

While the first oscillator 122 is operating, the second oscillator 124 may be operating, whereby the NTSC method can be quickly switched to the PAL method in the video scope 110. In this case, although another portion of the third wiring-pattern LL3', which extends from the second oscillator 124 to the cutoff EE3, is always supplied with the second type of basic clock pulse output from the second oscillator 124, irradiation of noise from the aforesaid other portion of the third wiring-pattern LL3' can be considerably reduced, because the cutoff EE3 is closed to the second oscillator 124, i.e. because the aforesaid other portion of the third wiring-pattern LL3' has a very small size.

When the PAL method is introduced in the video scope 110, the DSP 118 and the microcomputer 126 must be operated in accordance with the second type of basic clock pulse output from the second oscillator 124. Namely, the second oscillator 124 is necessary, but the first oscillator 122 is unnecessary. In this case, respective electrical connections are established at the cutoffs EE3 and FF3 with jumper wires JJ3' and JJ3", as shown in FIG. 11. Optionally, the establishment of the electrical connections at the cutoffs EE3 and FF3 may be carried out with solder drops. Thus, it is possible to operate the DSP 118 and the microcomputer 126 in accordance with the second type of basic clock pulse output from the second oscillator 122. Note, as is apparent from the foregoing, the second type of basic clock pulse is fed from the microcomputer 126 to the DSP 118 through the fourth wiring-pattern LL4'.

Accordingly, when the PAL method is introduced in the video scope 110, the second wiring-pattern LL2' partially remains as an unused wiring-pattern on the circuit board 146. In this case, as is apparent from FIG. 11, although a portion of the second wiring-pattern LL2, which extends between the cutoff FF2 and the location at which the third wiring-pattern LL3' is connected to the second wiring-pattern LL2', is always supplied with the second type of basic clock pulse, irradiation of noise-from that portion of the second wiring-patterns LL2' can be considerably reduced, because of the very small size thereof.

When the PAL method is introduced in the video scope 110, the quartz may be removed from the first oscillator 122, as shown in FIG. 11. If the removal of the quartz from the first oscillator 122 is ensured upon introducing the PAL method in the video scope 110, it is unnecessary to form the cutoff EE2 in the second wiring-pattern LL2'.

While the second oscillator 124 is operating, the first oscillator 122 may be operating, whereby the PAL method can be quickly switched to the NTSC method in the video scope 110. In this case, although another portion of the third wiring-pattern LL3', which extends from the DSP 118 to the cutoff EE2, is always supplied with the first type of basic clock pulse output from the first oscillator 122, irradiation of noise from the aforesaid other portion of the second wiring-pattern LL2' can be considerably reduced, because of the very small size thereof.

Note, in order to feed the second type of basic clock pulse from the second oscillator 124 to the microcomputer 126, although the third wiring-pattern LL3' is connected to the second wiring-pattern LL2' (FIGS. 9, 10, and 11), it may be directly connected to the microcomputer 126.

In the second embodiment, when one of the first and second oscillators 122 and 124 is selected and used, one of the first and second types of basic clock pulse is directly fed to one of the DSP 118 and the microcomputer 126, and is then fed to the other one of the DSP 118 and the microcomputer 126 through the aforesaid one. Thus, it is possible to establish and maintain a stable relationship on the operational timings between the DSP 118 and the microcomputer 126.

Finally, it will be understood by those skilled in the art that the foregoing description is of preferred embodiments of the system, and that various changes and modifications may be made to the present invention without departing from the spirit and scope thereof.

The present disclosure relates to subject matters contained in Japanese Patent Applications No. 2001-150335 (filed on May 21, 2001) and No. 2001-150574 (filed on May 21, 2001), which are expressly incorporated herein, by reference, in their entirety.

What is claimed is:

1. A video scope utilized in an electronic endoscope system, which comprises:
   an image sensor;
   a circuit board;
   an electronic package mounted on said circuit board to process image signals, read from said image sensor, to thereby produce at least two types of video signal; and
   a wiring-pattern formed on said circuit board so as to extend from said electronic package, to thereby feed a video signal component, included in one of said two types of video signal, from said electronic package, said wiring-pattern being cut off at a suitable location,
   wherein a portion of said wiring-pattern, which extends from said electronic package to the cutoff, is grounded to a ground layer of said circuit board through a suitable electric resistance when said wiring-pattern remains as an unused wiring-pattern on said circuit board.

2. A video scope as set forth in claim 1, wherein the portion of said wiring-pattern is grounded at the cutoff end.

3. A video scope as set forth in claim 1, wherein said electronic package comprises a digital signal processor which is constituted such that not only the processing of the image signals is performed but also the reading of the image signals from said image sensor is controlled.

4. A video scope utilized in an electronic endoscope system, which comprises:
   an image sensor;
   a circuit board;
   an electronic package mounted on said circuit board to process image signals, read from said image sensor, to thereby produce at least two types of video signal;
   a connector mounted on said circuit board; and
   a wiring-pattern formed on said circuit board so as to be extend between said electronic package and said connector, to thereby feed a video signal component, included in one of said two types of video signal, from said electronic package to said connector, said wiring-pattern being cut off at two suitable locations,
   wherein respective electrical connections are established at the cutoffs when said wiring-pattern is utilized.

5. A video scope as set forth in claim 4, wherein one of said cutoffs is located in the vicinity of said electronic package.

6. A video scope as set forth in claim 4, wherein said electronic package comprises a digital signal processor which is constituted such that not only the processing of the image signals is performed but also the reading of the image signals from said image sensor is controlled.

7. A video scope utilized in an electronic endoscope system, which comprises:
   an image sensor;
   a circuit board;
   an electronic package mounted on said circuit board to process image signals, read from said image sensor, to thereby produce a video signal;
   a microcomputer mounted on said circuit board to control an operation of said electronic package;
   a first oscillator mounted on said circuit board to produce a first type of basic clock pulse;
   a second oscillator mounted on said circuit board to produce a second type of basic clock pulse;
   each of said first and second types of basic clock pulse being used to regulate an operational timing of said electronic package and said microcomputer;
   a first wiring-pattern formed on said circuit board to feed said first type of basic clock pulse from the first oscillator to said electronic package;
   a second wiring-pattern formed on said circuit board to feed said first type of basic clock pulse from said electronic package to said microcomputer, said second wiring-pattern being cut off at a suitable location;
   a third wiring-pattern formed on said circuit board and connected to said second wiring-pattern to feed said second type of basic clock pulse from said second oscillator to said microcomputer, said third wiring-pattern being cut off at a suitable location; and
   a fourth wiring-pattern formed on said circuit board to feed said second type of basic clock pulse from said microcomputer to said electronic package,
   wherein, when one of said first and second wiring-patterns remains as an unused wiring-pattern on said circuit board, a portion of said unused wiring-pattern, which extends from said microcomputer to the cutoff, is grounded to a ground layer of said circuit board though a suitable electric resistance.

8. A video scope as set forth in claim 7, wherein the portion of said unused wiring-pattern is grounded at the cutoff end.

9. A video scope as set forth in claim 7, wherein a portion of said second wiring-pattern, which extends from said microcomputer to the cutoff, is grounded to the ground layer of said circuit board through a suitable electric resistance when said unused wiring-pattern is the second wiring-pattern and when said second oscillator is operating.

10. A video scope as set forth in claim 7, wherein a portion of said third wiring-pattern, which extends from said second wiring-pattern to the cutoff, is grounded to the ground layer of said circuit board though a suitable electric resistance when said unused wiring-pattern is the third wiring-pattern and when said first oscillator is operating.

11. A video scope as set forth in claim 7, wherein said electronic package comprises a digital signal processor which is constituted such that not only the processing of the image signals is performed but also the reading of the image signals from said image sensor is controlled.

12. A video scope utilized in an electronic endoscope system, which comprises:

an image sensor;

a circuit board;

an electronic package mounted on said circuit board to process image signals, read from said image sensor, to thereby produce a video signal;

a microcomputer mounted on said circuit board to control an operation of said electronic package;

a first oscillator mounted on said circuit board to produce a first type of basic clock pulse;

a second oscillator mounted on said circuit board to produce a second type of basic clock pulse;

each of said first and second types of basic clock pulse being used to regulate operational timings of said electronic package and said microcomputer;

a first wiring-pattern formed on said circuit board to feed said first type of basic clock pulse from the first oscillator to said electronic package;

a second wiring-pattern formed on said circuit board to feed said first type of basic clock pulse from said electronic package to said microcomputer;

a third wiring-pattern formed on said circuit board and connected to said second wiring-pattern to feed said second type of basic clock pulse from said second oscillator to said microcomputer; and a fourth wiring-pattern formed on said circuit board to feed said second type of basic clock pulse from said microcomputer to said electronic package, wherein said second wiring-pattern is at least cut off at a location in the vicinity of said microcomputer, the connection of said third wiring-pattern to said second wiring-pattern is established at a portion of said second wiring-pattern, which extends from said microcomputer to the cutoff, and said third wiring-pattern is at least cut off a locations of in the vicinity of the connection between said second wiring-pattern and said third wiring-pattern.

13. A video scope as set forth in claim 12, wherein said second wiring-pattern is further cut off at a location in the vicinity of said electronic package when the second wiring-pattern remains as an unused wiring-pattern on said circuit board and when said first oscillator is operating.

14. A video scope as set forth in claim 12, wherein said third wiring-pattern is further cut off at a location in the vicinity of said second oscillator when the third wiring-pattern remains as an unused wiring-pattern on said circuit board and when said second oscillator is operating.

15. A video scope as set forth in claim 12, wherein said electronic package comprises a digital signal processor which is constituted such that not only the processing of the image signals is performed but also the reading of the image signals from said image sensor is controlled.

* * * * *